United States Patent
Link et al.

(10) Patent No.: US 11,824,013 B2
(45) Date of Patent: Nov. 21, 2023

(54) PACKAGE SUBSTRATE WITH REDUCED INTERCONNECT STRESS

(71) Applicant: INTEL CORPORATION, Santa Clara, CA (US)

(72) Inventors: Lauren A. Link, Mesa, AZ (US); Andrew J. Brown, Gilbert, AZ (US); Sheng C. Li, Gilbert, AZ (US); Sandeep B. Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 950 days.

(21) Appl. No.: 16/541,734

(22) Filed: Aug. 15, 2019

(65) Prior Publication Data
US 2021/0050306 A1 Feb. 18, 2021

(51) Int. Cl.
H01L 23/00 (2006.01)
H01L 23/498 (2006.01)
H01L 23/14 (2006.01)
H01L 23/15 (2006.01)

(52) U.S. Cl.
CPC .......... *H01L 23/562* (2013.01); *H01L 23/145* (2013.01); *H01L 23/15* (2013.01); *H01L 23/49816* (2013.01); *H01L 23/49822* (2013.01); *H01L 23/49827* (2013.01); *H01L 23/49838* (2013.01); *H01L 24/16* (2013.01); *H01L 2224/16227* (2013.01); *H01L 2924/351* (2013.01)

(58) Field of Classification Search
None
See application file for complete search history.

(56) References Cited

U.S. PATENT DOCUMENTS 5,434,751 A  7/1995  Cole, Jr. et al.
5,451,721 A  9/1995  Tsukada et al.
(Continued)

FOREIGN PATENT DOCUMENTS

EP  1 491 927 B1  2/2013

OTHER PUBLICATIONS

Delin Li et al., "A Wide Area Vertical Expansion (WAVE) Packaging Process Development", IEEE, 2001, 5 pages.
(Continued)

*Primary Examiner* — Long Pham
(74) *Attorney, Agent, or Firm* — Schwabe, Williamson & Wyatt, P.C.

(57) ABSTRACT

Techniques for mounting a semiconductor chip in a circuit board assembly includes using different buildup materials on opposite sides of a core to optimize stress in the first level interconnect structure (between the chip and core) and/or the second level interconnect structure (between the core and circuit board). The core can be, for example, ceramic, glass, or glass cloth-reinforced epoxy. In one example, the first side of the core has one or more layers of conductive material within a first buildup structure comprising a first buildup material. The second side of the substrate has one or more layers of conductive material within a second buildup structure comprising a second buildup material different from the first buildup material. In another example, an outermost layer of the second buildup structure is a ductile material that functions to decouple stress in the interconnect between the substrate and a circuit board.

20 Claims, 6 Drawing Sheets

(56) References Cited

U.S. PATENT DOCUMENTS 7,855,342 B2    12/2010    Sakamoto et al.
8,072,768 B2    12/2011    Ockenfuss et al.

OTHER PUBLICATIONS

"Ball Grid Array", Wikipedia, retrieved from <URL: https://en.wikipedia.org/w/index.php?title=Ball_grid_array&oldid=899908465>, edited Jun. 2, 2019, 6 pages.
"Basic Mechanical and Thermal Properties of Silicon", Virginia Semiconductor, Inc., retrieved on Jun. 19, 2019, 5 pages.
Kazuhito Hikasa et al., "Development of Flexible Bumped Tape Interposer", Furukawa Review, No. 24, 2003, pp. 59-64.
"Information About Dow Corning Brand Die Encapsulants", Dow Corning, retrieved on Jun. 19, 2019, 5 pages.
"Properties of Silicon and Silicon Wafers", El-Cat Inc., retrieved on Jun. 19, 2019, 12 pages.

PACKAGE SUBSTRATE WITH REDUCED INTERCONNECT STRESS

BACKGROUND

A ball grid array (BGA) is a type of surface-mount packaging for components on a printed circuit board (PCB) assembly. For example, an integrated circuit package can be electrically connected to a PCB or wiring board using a grid of solder balls between surface contact pads on the PCB or wiring board and corresponding contact pads on the chip or package. After heating the solder balls to cause them to flow, the resulting solder connections electrically connect and mechanically fasten the package to the PCB or wiring board. A semiconductor chip can be similarly mounted to a package substrate. Flip-chip bonding is a similar bonding method for mounting semiconductor chips to external circuitry such as a substrate or another chip. After fabricating integrated circuits on the wafer, contact pads on the surface of the chips are metallized. Solder balls are deposited onto contact pads and the chips are cut and liberated. The chips are flipped and positioned so that the solder balls contact the connectors on the underlying substrate or other external circuitry. The solder is heated to reflow the solder, which results in a solid electrical and physical connection to the external circuitry. An underfill material, such as an epoxy resin or the like, can be injected or otherwise applied between the chip and the external circuitry to provide mechanical support to the chip and to enhance heat transfer between the chip and the external circuitry.

The figures depict various embodiments of the present disclosure for purposes of illustration only. Numerous variations, configurations, and other embodiments will be apparent from the following detailed discussion.

DETAILED DESCRIPTION

Disclosed are methodologies for reducing stress in interconnect structures of integrated circuit chip packages and printed circuit board (PCB) assemblies. In accordance with one embodiment, a substrate for mounting a semiconductor chip is configured with buildup materials so that thermal and mechanical stress is reduced between the substrate and the PCB and/or between the substrate and a chip mounted to the substrate. In one example embodiment, the substrate includes a highly ductile layer of material, referred to herein as "decoupling material", as the outermost buildup material on one side of the substrate. In one such embodiment, the decoupling material has an increased coefficient of thermal expansion (CTE), a reduced Young's modulus, and an increased elongation compared to other buildup materials. When the substrate is attached to the PCB via solder connections, the decoupling material reduces stress in the second level interconnect (SLI) by allowing independent thermal expansion of the PCB and the substrate. For example, the decoupling material relieves stress from the solder joint and the ball grid array (BGA) pad without increasing the overall CTE of the substrate. Accordingly, the decoupling material has little or no adverse impact on the performance of the first level interconnect (FLI) on the opposite side of the substrate. As will be appreciated, note that the FLI generally refers to electrical connections between a package substrate and a chip, and the SLI generally refers to electrical connections between a package substrate and a PCB.

In other embodiments, a substrate is configured with different buildup materials on each side of the substrate core. In one such embodiment, the buildup material on the first side is optimized for a semiconductor chip or die, such as a silicon chip, germanium chip, or a III-V chip. The buildup material on the second side is optimized for the PCB. A substrate with this configuration can reduce thermal stress in both the FLI and the SLI. In one specific example embodiment, the first buildup material on the first side has a relatively high modulus and low CTE suitable for mounting a silicon chip. On the opposite second side, the second buildup material has a lower modulus and larger CTE optimized for attachment to a PCB. For example, the first buildup material has a CTE of about 3 ppm/° C., which is about equal to the CTE of silicon at room temperature. The second buildup material has a CTE of about 20 ppm/° C., which is about equal to the CTE of a typical PCB. By selecting the buildup materials on opposite sides of the core to have properties optimized for a chip and for a PCB, respectively, both FLI and SLI thermomechanical stress can be reduced and in turn improve reliability for the assembly. In some embodiments, the substrate has a high-stiffness core to further reduce FLI stress and mitigate warpage potentially resulting from the asymmetric properties of the substrate. For example, the core has a Young's modulus E' of about 40 GPa or greater. Numerous variations and embodiments will be apparent in light of the present disclosure.

General Overview

Similar to a PCB, an example substrate for mounting an integrated circuit chip has a ceramic or glass core with layers of copper foil or other conductive material on both sides of the core in a multi-layer, laminated assembly. Conductive traces are defined in each layer of the copper and vias interconnect conductive traces on various copper layers. A buildup material of dielectric resin is between conductive layers in the laminated assembly. Contact pads on the surface of the substrate are used to make electrical contact with various conductive traces. As previously noted, the electrical connections between the package substrate and a chip may be referred to as first level interconnect (FLI), whereas electrical connections between the package substrate and the PCB may be referred to as second-level interconnect (SLI). The substrate may also have a solder mask on the front and back surfaces to protect and isolate the outermost conductive layers, except at contact pads and other locations where electrical connections can be made, for example.

During thermal cycling, differences in coefficients of thermal expansion (CTE) between the chip, the substrate, and the PCB can result in mechanical stress that results in premature failure of the solder joints in the FLI and/or SLI. For example, heat from circuit operation and during assembly of the circuit board assembly can cause expansion of the dielectric resin. Such expansion can apply a mechanical stress on components and solder connections. As the industry moves towards package substrates having lower CTEs to accommodate growing die sizes and increased reliability requirements, the CTE mismatch between the substrate and the PCB is getting worse. Increased SLI stress results in degradation of board-level reliability. In industries requiring high reliability, such as automotive technologies, 5G communications, and silicon photonics, the reliability issues associated with FLI and SLI stress are increasingly problematic. Techniques have been implemented to address some aspects of thermal stress in a circuit board assembly, but a number of non-trivial issues remain.

One approach to address thermal stress is to inject underfill material (e.g., an epoxy) between the PCB surface and the mounted device. For motherboards and other relatively large devices, the underfill may be referred to as board-level underfill (BLUF). The underfill secures the package to the PCB and may also facilitate thermal transfer. When BLUF is applied around the BGA solder balls in the gap between the PCB and a package, for example, the stress on the solder mask can be reduced. Such an approach has shown some success in reducing cracking and delamination of the solder mask, but the BLUF does not sufficiently relieve the stress through the solder joint, which includes the PCB's contact pad, the solder ball, and the contact pad on the substrate. In other words, BLUF does not decouple the stress, but only helps reduce cracking or delamination on the surface of the PCB and substrate. Such approach also increases cost and complexity of the assembly process. Therefore, a need exists for improvements in packaging technologies to reduce mechanical and/or thermal stress in circuit board assemblies. The present disclosure addresses this need, among others.

In accordance with one embodiment of the present disclosure, a substrate includes a compliant buildup material as the outermost layer of buildup material on the back side of the substrate. The compliant buildup material decouples SLI stress and allows for independent expansion of the substrate and the PCB. The compliant buildup material relieves stress from the solder joint in the SLI and contact pad without increasing the overall CTE of the substrate. Unlike other approaches, a substrate with the compliant buildup material has little or no adverse effect on the FLI stress. Accordingly, the complaint buildup material can be used to optimize SLI stress independently of the FLI.

In accordance with another embodiment, different buildup materials on opposite sides of the substrate core are selected to have properties aligned with those of an integrated circuit die or chip. For example, the first side of the substrate has a first buildup material with a modulus and coefficient of thermal expansion that generally match or approximate those values of a semiconductor chip, such as a silicon chip. The second side has a second buildup material with a modulus and CTE that generally matches or approximates those values of a printed circuit board. Since the first and second buildup materials are on opposite sides of the substrate core, each can be separately tailored to a chip or PCB without significant (if any) effect on the other. Unlike known techniques where relieving FLI stress can adversely impact SLI stress and vice versa, using different buildup materials on opposite sides of the substrate can be used to reduce or optimize both the FLI and SLI stress, in accordance with some embodiments.

Experimental results with some embodiments of the present disclosure have shown a 50% increase in reliability during thermal cycling tests between −40° C. and 125° C. For example, reliability performance in one assembly improved from 1000 cycles to 1500 cycles. Another example embodiment utilizing a low-CTE, high-modulus buildup material reinforced with glass cloth has passed reliability testing to 4000 cycles. These and other performance improvements can be significant to technologies requiring increased reliability.

As discussed herein, terms referencing direction, such as upward, downward, vertical, horizontal, left, right, front, back, etc., are used for convenience to describe a package substrate oriented in a horizontal plane. Embodiments of the present disclosure are not limited by these directional references and it is contemplated that substrates and related assemblies of the present disclosure could be used in any orientation.

Example buildup materials include, for instance, epoxy, polyimide, polyester, or other polymer, combination of polymers, or polymer composites along with and additives and filler particles (e.g., silica), as will be appreciated. Also note that although referred to herein as a buildup material, such disclosed materials may also be referred to as a microelectronics encapsulant, mold material, mold compound, underfill material, dielectric material, or dielectric resin. All these terms are considered interchangeable as used herein, and generally refer to a dielectric material having certain qualities, such as a certain CTE, Young's modulus, and/or elongation. Similarly, a substrate for mounting an integrated circuit chip may be referred to simply as a substrate, a package substrate, a chip-mounting substrate, or other suitable term.

Note that materials described being "compositionally different" or "compositionally distinct" as used herein refers to two materials that have different chemical compositions. This compositional difference may be, for instance, by virtue of an element that is in one material but not the other (e.g., polyimide is compositionally different from polyester), or by way of one material having all the same elements as a second material but at least one of those elements is intentionally provided at a different concentration in one material relative to the other material (e.g., an epoxy with 40 wt. % silica filler is compositionally different from an epoxy with 25 wt. % silica filler). In addition to such chemical composition diversity, the materials may also have distinct fillers (e.g., silica or alumina) or the same filler material but at differing concentrations or different particle sizes.

Use of the techniques and structures provided herein may be detectable using tools such as optical microscopy; high resolution physical or chemical analysis; chemical characterization, such as x-ray crystallography or diffraction (XRD), energy-dispersive x-ray spectroscopy (EDX), or Fourier Transform Infrared Spectroscopy (FTIR); scanning/transmission electron microscopy (SEM/TEM), scanning transmission electron microscopy (STEM), nano-beam electron diffraction (NBD or NBED), and reflection electron microscopy (REM); composition mapping; secondary ion mass spectrometry (SIMS); time-of-flight SIMS (ToF- SIMS); atom probe imaging or tomography; local electrode atom probe (LEAP) techniques; and 3D tomography, to name a few suitable example analytical tools. In particular, in some embodiments, an optical microscope and chemical characterization may be used to identify a chip-mounting substrate that includes different buildup materials on the front and back sides of the substrate core, buildup materials on the front and back sides that contain different fillers, a ductile decoupling material as the final buildup material on one side of the substrate, and/or a substrate core having a modulus E' greater than 40 GPa. Such characterization may similarly be useful to identify a substrate with buildup materials on opposite sides of the core that have a coefficient of thermal expansion and other properties tailored to a chip and/or PCB.

Example Embodiments

Figure 1:
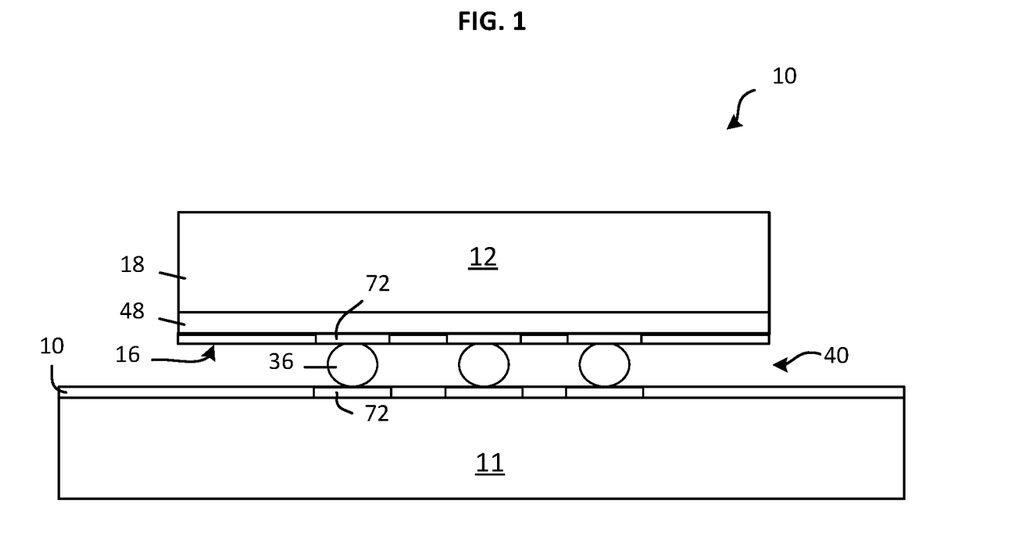
FIG. 1 is a cross-sectional view showing a package substrate attached to a printed circuit board with solder balls, where a compliant buildup layer is the final buildup layer on the back side of the substrate, in accordance with an embodiment of the present disclosure.

FIG. 1 illustrates a cross-sectional view showing a substrate 12 for mounting an integrated circuit chip mounted to a printed circuit board (PCB) 11, where solder connections 36 between the substrate 12 and the PCB are part of a second level interconnect (SLI) 40, in accordance with an embodiment of the present disclosure. In this example, the substrate 12 includes layer of decoupling material 48 as the final layer of buildup material (or only layer of buildup material as the case may be) on the back or second side 16 of the substrate core 18. In this example, the second side 16 also includes contact pads 72 and a solder mask 32 on the surface of the decoupling material 48 such that the decoupling material 48 is between the solder mask 32 and the core 18.

The decoupling material 48 is a compliant material that enables independent thermal expansion of the substrate 12 and the PCB 11. In one such embodiment, the decoupling material 48 has a Young's Modulus E' from 30-70 MPa, including 30-60, 30-50, 30-40, 40-70, 40-60, 45-55, 40-50, 50-70, and 50-60 MPa. In some embodiments, the decoupling material 48 also has an elongation of at least 50%, including at least 55%, at least 60%, and at least 65%. For example, the decoupling material 48 has a CTE of about 98 ppm/° C., a Young's Modulus E' ("modulus") of about 50 MPa, and an elongation of about 67%. Advantageously, such a material has a modulus that is two orders of magnitude lower than and an elongation that is about 10 times greater than these values found in buildup materials in current use. Also, such a decoupling material 48 is fungible with existing buildup materials without significant changes to tooling or the manufacturing process of a substrate 12. Further, the decoupling material 48 can be used as the final build up material in compliance with existing thickness specifications, as will be appreciated.

Figure 2:
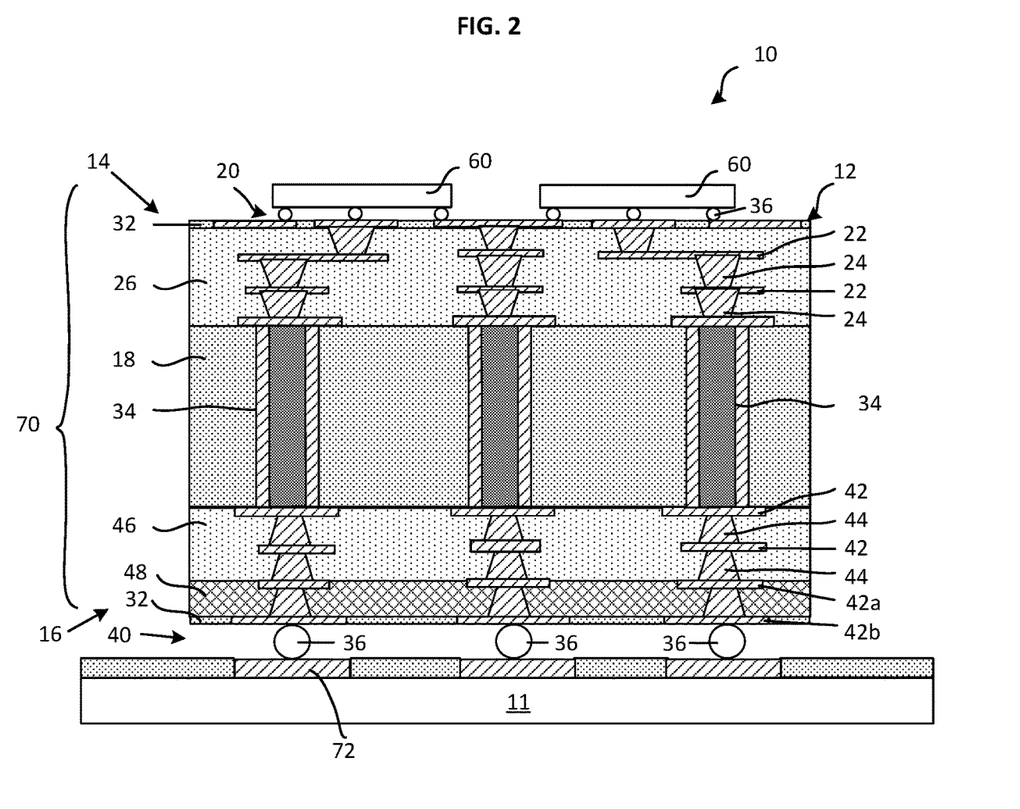
FIG. 2 is a cross-sectional view of part of a printed circuit board assembly that includes a package substrate with the compliant buildup material and semiconductor chips mounted to the front of the substrate, in accordance with an embodiment of the present disclosure.

FIG. 2 illustrates a cross-sectional view of a circuit board assembly 10 that includes a substrate 12 for mounting an integrated circuit chip, in accordance with another embodiment of the present disclosure. In this example embodiment, chips 60 are mounted to a first side 14 of the substrate 12 via a first level interconnect (FLI) 20. The second side 16 of the substrate 12 is attached to a PCB 11 via a second level interconnect (SLI) 40. The FLI 20 includes solder connections 36 between the substrate 12 and chips 60 and the SLI 40 includes solder connections 36 between the substrate 12 and the PCB 11. The substrate 12 includes a core 18, one or more layers of conductive material 22, 42, and buildup materials 26, 46, 48 in a laminated, multi-layer structure. The core 18 may comprise ceramic, phenolic, glass cloth-reinforced epoxy, borosilicate glass, fused silica, or other suitable material, as will be appreciated. In one example, the core is glass with a thickness from 200-500 μm and a coefficient of thermal expansion of about 3.2 ppm/° C. Some or all of the layers of conductive material 22, 42 (e.g., copper foil, copper on titanium) define conductive traces or circuits as needed. Although illustrated as having several layers of conductive material 22, 42, the substrate 12 can include one, two, four, eight, twelve, or other number of layers of conductive material 22, 42 on each side of the core 18. Vias 24, 44 extend between and electrically connect various layers of the conductive material 22, 42 to define circuits (or conductive paths for circuits), as will be appreciated. Optionally, the substrate 12 includes one or more through-core vias 34 that electrically connect conductive material 22, 42 on opposite sides of the core 18.

On the first side 14, a first buildup material 26 occupies space between vias 24 and layers of conductive material 22. The first buildup material 26 is adjacent or in contact with the core 18 and extends to an optional first solder mask 30 at the surface of the substrate 12. On the second side 16, a second buildup material 46 occupies space between vias 44 and conductive material 42. The second buildup material 46 is adjacent or in contact with the core 18 and extends to the second outermost layer of conductive material 42a. The second buildup material 46 can be the same as or compositionally different from the first buildup material 26.

It will be appreciated that buildup materials that are compositionally different may differ in the composition of one or more components, and that these differences may result in different physical properties. For example, a buildup material can be a dielectric resin with or without fillers or additives. One buildup material may differ from another buildup material due to a difference in the chemical composition of the dielectric resin; a difference in the composition, shape, or concentration of filler(s) contained in the resin; a difference in additives (e.g., hardener, catalysts); or a combination of such differences.

Each of the first and second buildup materials 26, 46 can be a buildup film suitable for flexible circuits, such as an epoxy, polyimide, polyester, or other polymer or combination of polymers. In some embodiments, the buildup material includes filler particles, such as silica. Further, the buildup materials may include a hardener or curing agent, such as a phenol hardener. In one embodiment, a buildup material contains silica particles in an amount of 45% or less by weight, including 40% or less, 35% or less, 30% or less, 25% or less, 20% or less, 15% or less, 10% or less, and 5% or less. Numerous variations and embodiments will be apparent in light of the present disclosure.

A third buildup material or layer of decoupling material 48 is on the second buildup material 46 on the second side 16. Here, the decoupling material 48 is between the second buildup material 46 and the second solder mask 32. For example, the decoupling material 48 is a final or outermost layer of buildup material between the outermost layer 42b and second outermost layer 42a of conductive material 42. As shown in this example, the decoupling material 48 is a single layer of buildup material; in other embodiments, the decoupling material 48 may be two or more of the outermost layers of buildup material. When present, the second solder mask 32 is on the outside face of the outermost layer 42a of conductive material 42 and/or on the outside face of the decoupling material 48 such that the decoupling material 48 is between the solder mask 32 and the second buildup material 46.

Semiconductor chips 60 can be mounted on the first side 14 of the substrate 12 and make electrical contact with conductive traces formed in the conductive material 22, 42 via the FLI 20. Each chip 60 can be a sensor, laser diode, processor, memory structure, or other integrated circuit device or combination of devices with a semiconductor substrate, for example. The substrate 12 can be mounted to a PCB 11 via second level interconnect (SLI) 40. Examples of FLI 20 and SLI 40 include a ball grid array (BGA), land grid array (LGA), or other conductive structure. Although not shown in FIG. 2, it will be appreciated that some surface-mount methodologies include a socket assembly that aligns and secures the integrated circuit package 70 (including substrate 12 and chip(s) 60) to the PCB 11. The PCB 12 can be configured as a motherboard, a daughter board, or a network card, for example. Also, an underfill material (not shown) may be applied between the chip(s) 60 and the substrate 12 and/or between the substrate 12 and the PCB 11 as needed.

As noted above, stress on the second level interconnect (SLI) 40 is attributed primarily to the mismatch in coefficient of thermal expansion (CTE) between the substrate 12 and the PCB 11. To reduce SLI stress, the decoupling material 48 is selected in some embodiments as a highly ductile material that is compliant with materials having a low modulus and low CTE (e.g., the second buildup material 46 and core 18). The decoupling material 48 functions to decouple movement between the substrate 12 and the PCB 11 during thermal cycling to reduce SLI stress on the solder connection 36, conductive layer(s) 42, and/or contact pads 72 on the second side of the core 18.

As discussed above, the decoupling material 48 has a Young's Modulus E' from 30-70 MPa, including 30-60, 30-50, 30-40, 40-70, 40-60, 45-55, 40-50, 50-70, and 50-60 MPa, in accordance with some embodiments. The decoupling material 48 also has an elongation of at least 50%, including at least 55%, at least 60%, and at least 65%. For example, the decoupling material 48 has a CTE of about 98 ppm/° C., a Young's Modulus E' ("modulus") of about 50 MPa, and an elongation of about 67%. Advantageously, such a material has a modulus that is two orders of magnitude lower than and an elongation that is about 10 times greater than these values found in buildup materials in current use. Also, such a decoupling material is fungible with existing buildup materials without significant changes to tooling or the manufacturing process. Further, the decoupling material 48 can be used as the final build up material in compliance with existing thickness specifications, as will be appreciated.

Figure 3:
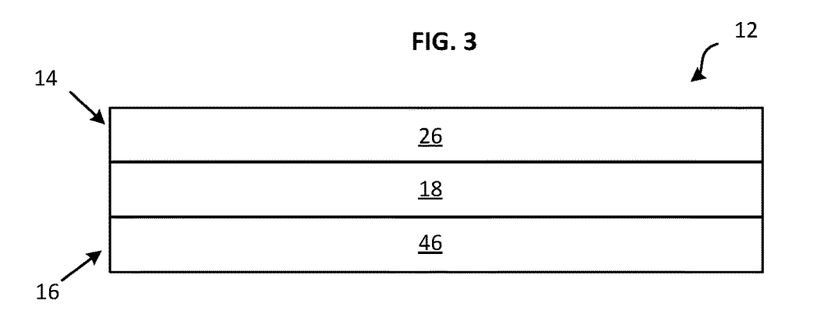
FIG. 3 is a cross-sectional view of a package substrate with different buildup materials on each side of the core, in accordance with an embodiment of the present disclosure.

Referring now to FIG. 3, a cross-sectional view illustrates a substrate 12 with a core 18, first buildup material 26 on the first side 14 of the core 18, and a second buildup material 46 on the second side 16 of the core 18, in accordance with another embodiment of the present disclosure. In this example, the first and second buildup materials 26, 46 are compositionally distinct and are selected to optimize the respective thermal stress in first level interconnect (FLI) 20 and second level interconnect (SLI) 40 (shown, e.g., in FIG. 4).

Figure 4:
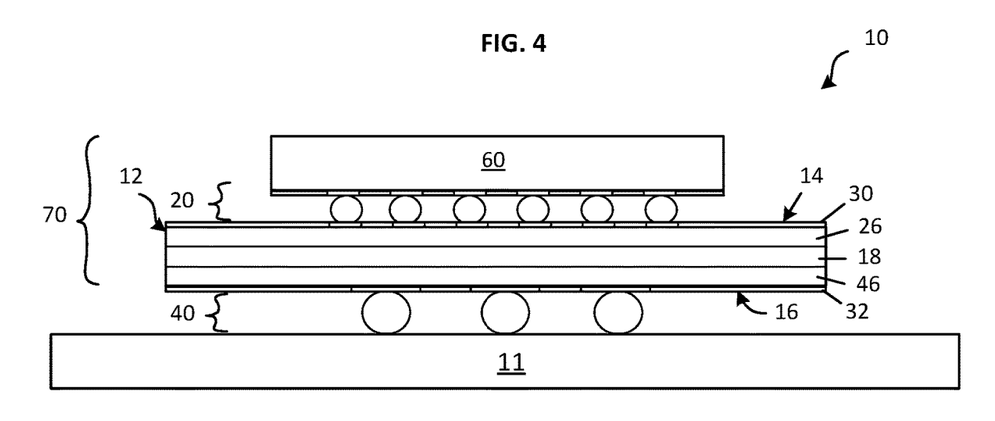
FIG. 4 is a cross-sectional view of the substrate of FIG. 3 shown in an assembly with a semiconductor chip and printed circuit board, in accordance with an embodiment of the present disclosure.

FIG. 4 illustrates a cross-sectional view of a circuit board assembly 10 that includes an integrated circuit chip 60 mounted to a substrate 12 and the substrate 12 mounted to a PCB 11. The FLI 20 includes solder connections 36 between contact pads 72 on the substrate 12 and on the chip 60. The SLI 40 includes solder connections between contact pads 72 on the second side 16 of the substrate 12 and the PCB 11. A first solder mask 30 is on the first side 14 of the substrate 12 and a second solder mask 32 is on the second side 16. Note that the relative sizes and thicknesses of features in FIG. 4 are not necessarily to scale.

Figure 5:
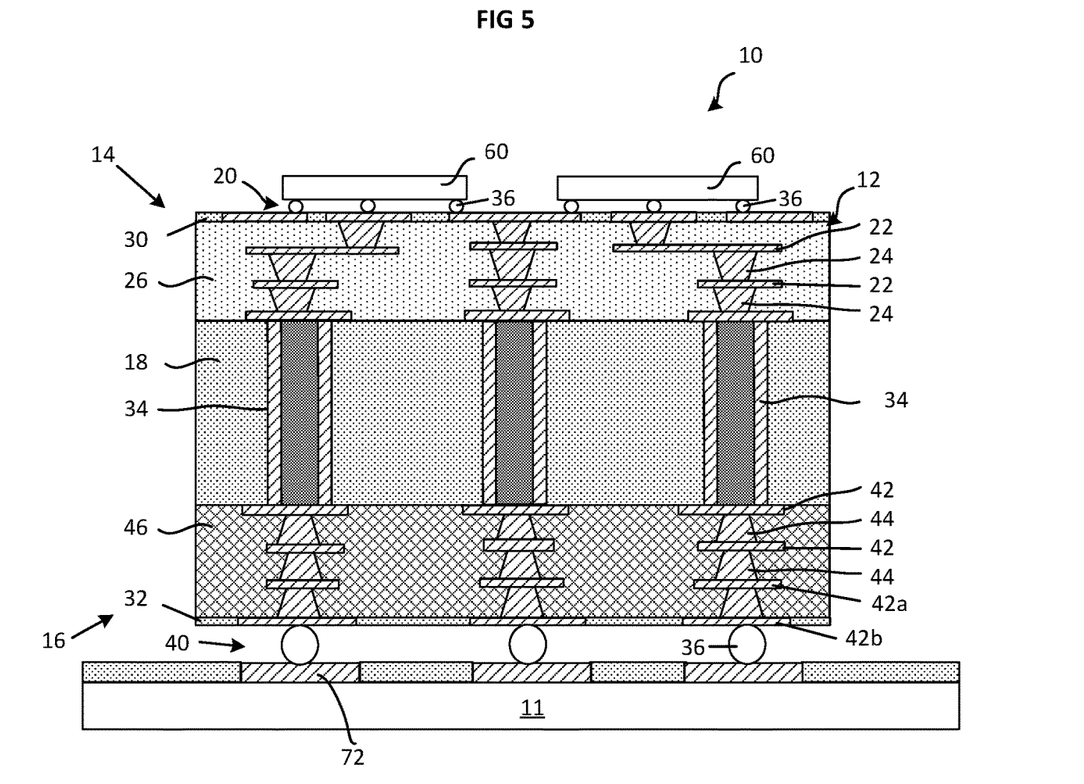
FIG. 5 is a cross-sectional view of part of a printed circuit board assembly that includes a package substrate with different buildup materials on each side of the core, in accordance with an embodiment of the present disclosure.

Referring now to FIG. 5, a cross-sectional view illustrates a portion of a circuit board assembly 10 in accordance with another embodiment of the present disclosure. Similar to embodiments discussed above, the circuit board assembly 10 includes a substrate 12 with a chip 60 mounted to the surface of a first side 14 and a PCB 11 (e.g., motherboard) mounted to the surface of the opposite second side 16. A first level interconnect 20 (FLI) is between the substrate 12 and chips 60, and a second level interconnect 40 (SLI) between the substrate 12 and PCB 11. In this example, the substrate 12 has an asymmetrical configuration with different buildup materials 26, 46 on the first side 14 and second side 16 of the core 18.

As discussed above, the first and second buildup materials 26, 46 can be a buildup material suitable for flexible circuits, such as an epoxy, polyimide, polyester, or other polymer or combination of polymers. In some embodiments, a buildup material includes filler particles, such as silica. Further, a buildup material may include a hardener or curing agent, such as a phenol hardener. In one embodiment, a buildup material contains silica particles in an amount of 45% or less by weight, including 40-45%, 40% or less, 35% or less, 30% or less, 25% or less, 20% or less, 15% or less, 10% or less, and 5% or less. Numerous variations and embodiments will be apparent in light of the present disclosure.

In some embodiments, the core 18 is selected to have high stiffness. For example, the core 18 has a Young's Modulus E' of at least 30 GPa, including at least 40 GPa, at least 60 GPa, at least 80 GPa, at least 100 GPa, at least 125 GPa, at least 150 GPa. Stated differently, the core 18 can have a modulus from 30-200 GPa, 40-100 GPa, 30-90 GPa, 40-70 GPa, 100-200 GPa, 100-180 GPa, 100-150 GPa, 130-200 GPa, 130-180 GPa, or 130-160 GPa. The core 18 may be of ceramic, glass, or glass cloth-reinforced epoxy, to name a few examples. The core 18 also has a relatively low CTE, in accordance with some embodiments. For example, the core 18 has a CTE of not greater than 10 ppm/° C., including 8 ppm/° C. or less, 6 ppm/° C. or less, and 4 ppm/° C. or less. Stated differently, the core 18 can have a CTE from 0-10 ppm/° C., 0-8 ppm/° C., 0-6 ppm/° C., 0-4 ppm/° C., 1-10 ppm/° C., 1-8 ppm/° C., 1-6 ppm/° C., 1-4 ppm/° C., 2-10 ppm/° C., 2-8 ppm/° C., 2-6 ppm/° C., 2-4 ppm/° C., 4-10 ppm/° C., 4-8 ppm/° C., 4-6 ppm/° C., 6-10 ppm/° C., or 6-8 ppm/° C. In some particular examples, the core 18 is a ceramic core with a CTE of 4-8 ppm/° C. and modulus of 130-180 GPa, a glass core with a CTE of 1-4 ppm/° C. and modulus of 70-80 GPa, or a glass cloth-reinforced epoxy core with a CTE of 4-6 ppm/° C. and modulus of about 40 GPa. Table 1 below lists properties for some example embodiments of core 18:

TABLE 1

|  | Ceramic Core | Glass Core | Glass Cloth-Reinforced Epoxy Core |
| --- | --- | --- | --- |
| CTE | 4-8 ppm/° C. | 1-4 ppm/° C. | 4-6 ppm/° C. |
| Modulus (E') | 130-180 GPa | 70-80 GPa | 40 GPa |

As shown in FIG. 5, the first buildup material 26 is between layers of conductive material 22 on the first side 14 of the core 18. The second buildup material 46 is between conductive material 42 on the second side 16. On the first side 14 of the core 18, the first buildup material 26 is selected to have properties suitable for mounting a chip, such as a chip with a substrate of silicon or other semiconductor material. For example, the first buildup material 26 has a relatively low CTE and relatively high modulus. On the second side 16 of the core 18, the second buildup material 46 is selected to have properties suitable for mounting the substrate 12 to a PCB 11. For example, the second buildup material 46 has a relatively high CTE and relatively low modulus.

In one embodiment, the first buildup material 26 has a CTE not greater than 15 ppm/° C., including not greater than 12 ppm/° C., not greater than 10 ppm/° C., and not greater than 8 ppm/° C. In some embodiment, the first buildup material 26 also has a modulus E' (at 25° C.) of at least 10 GPa, including at least 12 GPa, at least 15 GPa, and at least 20 GPa. The first buildup material 26 can have an elongation of 2% or less, including 1.5% or less, or as about 1.2%, in accordance with some embodiments.

In one embodiment, the second buildup material 46 has a CTE of at least 30 ppm/° C., including at least 35 ppm/° C., at least 40 ppm/° C., and at least 50 ppm/° C. The second buildup material 46 also has a modulus E' (at 25° C.) of no greater than 10 GPa, including not greater than 8 GPa, no greater than 6 GPa, and not greater than 4 GPa. The second buildup material 46 can also have an elongation of 4% or more, such as about 5%, in accordance with some embodiments.

Table 2 below lists properties for some example embodiments of the first and second buildup materials 26, 46:

TABLE 2

|  | First buildup material | Second buildup material |
| --- | --- | --- |
| CTE | 12 ppm/° C. | 46 ppm/° C. |
| E' (25° C.) | 15 GPa | 4 GPa |
| Elongation | 1.2% | 5.0% |

Note that some examples of substrates 12 are discussed above in the context of a circuit board assembly that includes one or more chips 60. However, substrates 12 of the present disclosure do not require the chip(s) 60 or PCB 11 to be included. These and other components can be assembled at a different stage of product completion or not at all, as will be appreciated. Additionally, some substrates 12 in accordance with the present disclosure may include layers of conductive material (e.g., the outermost or final conductive layer) that are blank or ready for further processing, while in other embodiments, layers of conductive material may be patterned to define conductive traces and/or circuits. Further, substrates 12 may or may not include a solder mask. Numerous variations and embodiments will be apparent in light of the present disclosure.

Figure 6:
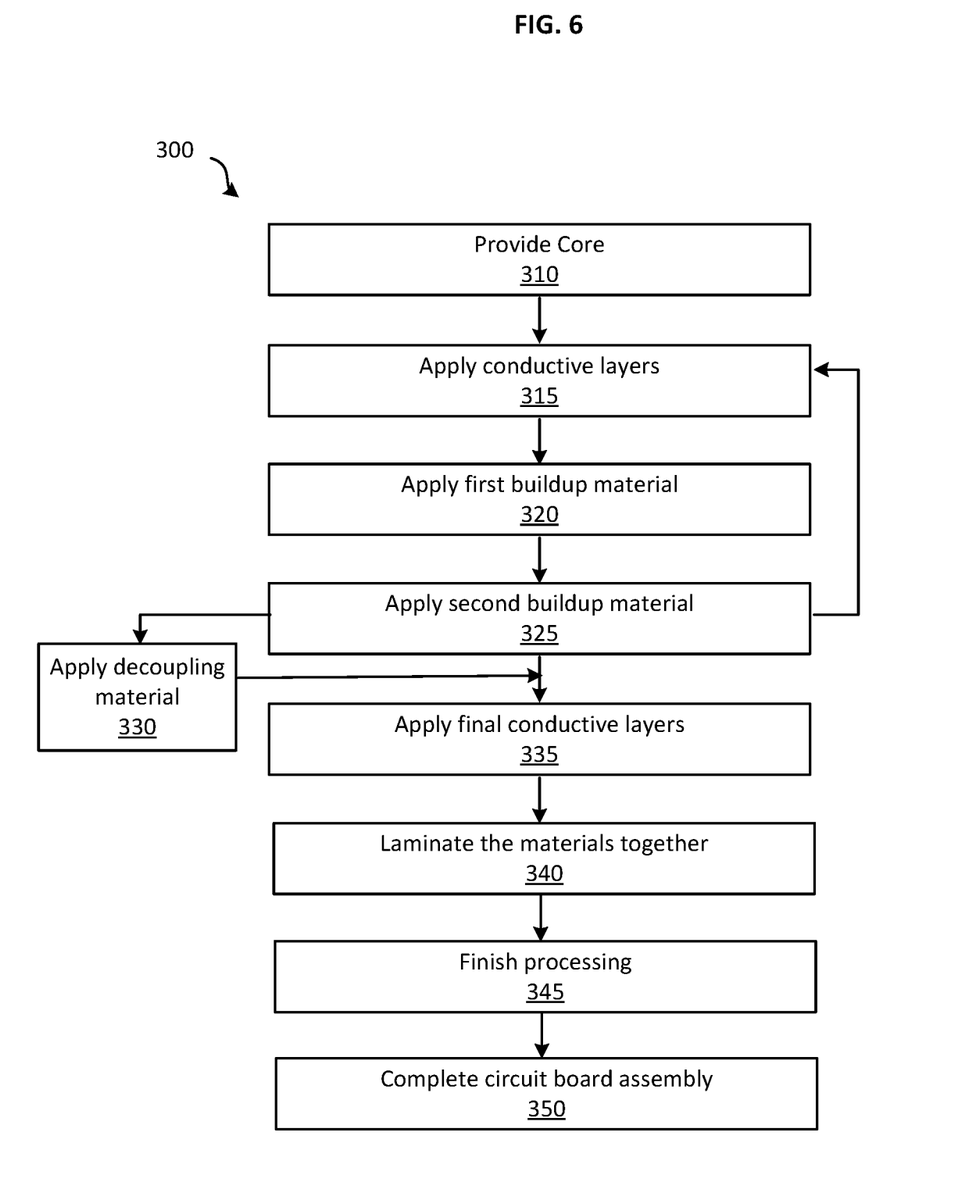
FIG. 6 is a flow chart showing a method of making a circuit board assembly, in accordance with an embodiment of the present disclosure.

Referring now to FIG. 6, a flow chart illustrates a method 300 of making a circuit board assembly, in accordance with some embodiments. In one embodiment, method 300 begins with providing 310 a core 18. In some embodiments, the core 18 is or includes a ceramic, phenolic, glass cloth-reinforced epoxy, borosilicate glass, fused silica, or other suitable material, as will be appreciated. In one example, the core is glass with a thickness from 200-500 μm and a coefficient of thermal expansion of about 3.2 ppm/° C. In some embodiments, the is selected to have high stiffness, such as discussed above.

Method 300 continues with applying 315 a first layer of conductive material (e.g., copper foil) to each side of the core. The conductive material can be patterned 320 and etched to define conductive traces, contact pads, and other features of an electrical circuit, as will be appreciated. Any suitable processing can be used, including lithography and etch processing. In some embodiments, the conductive material is etched prior to applying 315 to the core. In some such embodiments, the conductive material and core may first be aligned and drilled for subsequent re-alignment.

After applying 315 the conductive material, method 300 continues with applying 320 a first buildup material on the first side and applying 325 a layer of second buildup material on the second side. In some embodiments, the first buildup material is compositionally distinct from the second buildup material, such as in examples discussed above. Applying 320 the first buildup material and applying 325 the second buildup material may be performed in the same or separate operations using any suitable process. For example, when the first and second buildup materials are the same, the materials may be applied 320, 325 on both sides of the core in a single operation. In other embodiments, applying 320 the first buildup material is a separate operation from applying 325 the second buildup material.

Processes 315-325 can be repeated to define a multi-layer structure, as will be appreciated. Note that the first side and second side of the substrate need not have the same number of layers. Accordingly, one or both of processes 320 or 325 may be optional in subsequent processing cycles.

In one embodiment, the final layer of buildup material is a highly ductile decoupling material that is compositionally distinct from the second buildup material. For example, method 300 includes applying 330 a layer of decoupling material as the final layer of buildup material on the second side. For example, after defining one or more layers using the second buildup material, the final layer(s) of buildup material on the second side is the highly ductile decoupling material. In some such embodiments, applying 330 the decoupling material is performed when the first and second buildup materials are the same, but this condition is not required.

Method 300 continues with applying 335 a final or outermost layer of conductive material (e.g., copper foil) on the buildup materials. Process 335 optionally includes patterning and etching the outermost layer of conductive material to define contact pads, conductive traces, and other features.

Method 300 continues with laminating 340 the core, conductive material, and buildup materials to define a multi-layer substrate. In one embodiment, laminating 345 includes subjecting the layered structure to heat and pressure to fuse together the materials.

Method 300 optionally includes completing 350 a circuit board assembly that includes the substrate with one or more semiconductor chips attached to the first side and attaching the second side of the substrate to a printed circuit board. Method 300 may include other processes as needed to align, pattern, and finish the substrate, including but not limited to drilling, defining vias, coating drilled openings with conductive material, curing buildup materials, deposition of a solder mask, application of underfill materials, etc. Further, Numerous variations and embodiments will be apparent in light of the present disclosure.

Example Computing System

Figure 7:
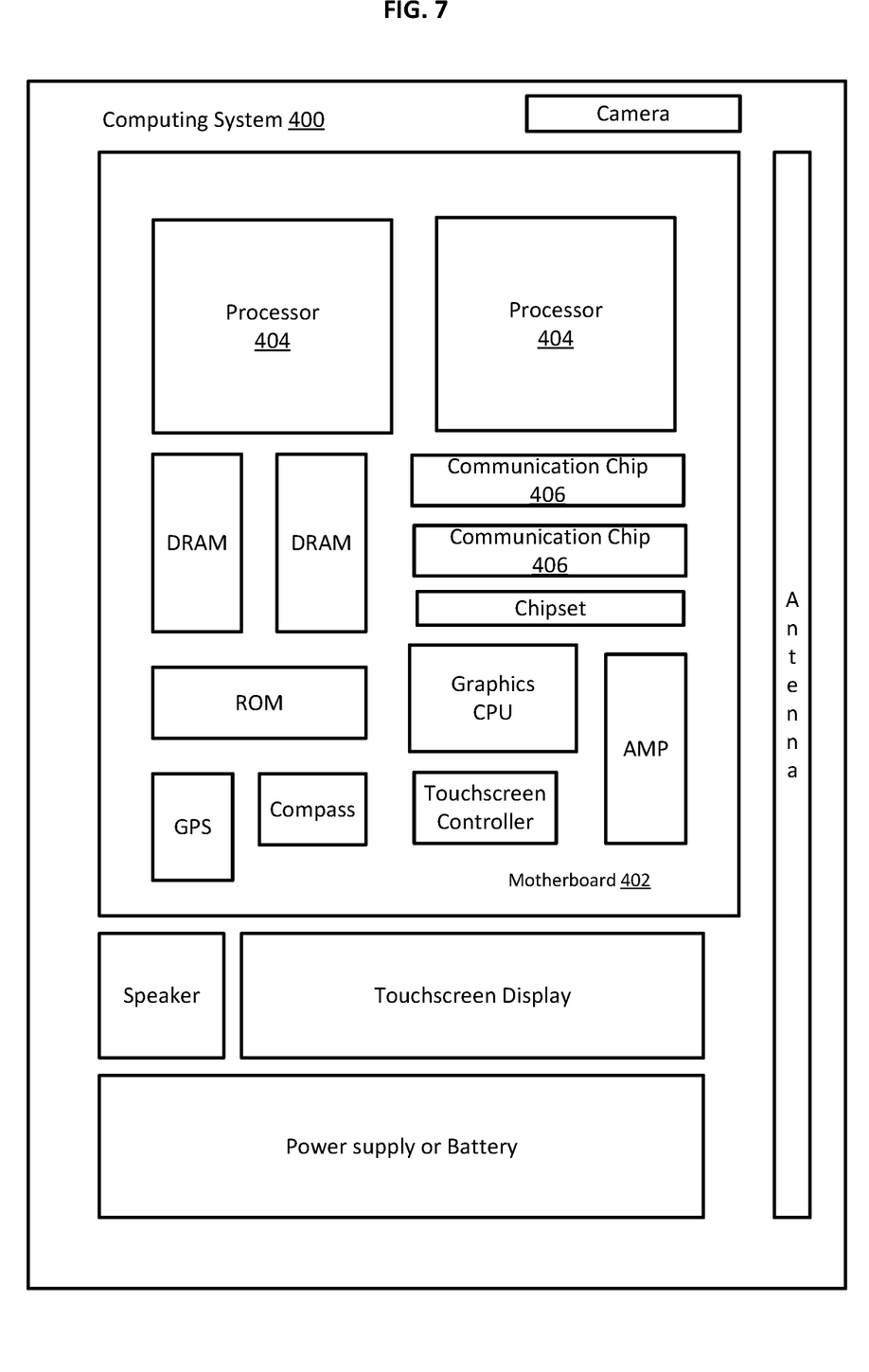
FIG. 7 illustrates a computing system utilizing one or more circuit board assemblies, in accordance with an embodiment of the present disclosure.

Referring now to FIG. 7, an example computing system 400 is shown that is implemented with one or more of the circuit board assemblies 10 as variously disclosed herein, in accordance with some embodiments of the present disclosure. As can be seen, the computing system 400 houses a motherboard 402. The motherboard 402 may include a number of components, including, but not limited to, one or more processor 404 and at least one communication chip 406, each of which can be physically and electrically coupled to the motherboard 402 using a substrate as variously described herein or as otherwise integrated therein. As will be appreciated, the motherboard 402 may be, for example, any printed circuit board, whether a main board, a daughterboard mounted on a main board, or the only board of system 400.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery or power supply, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., note that the communication chip 406 can be part of or otherwise integrated into the processor 404). Some such chips can be attached to a substrate and mounted to a circuit board, such as discussed herein.

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processors 404 of the computing system 400 each includes an integrated circuit die packaged within the processor 404. In some embodiments, processors 404 and chips 406 may be mounted as variously described herein, where one or more chips 406 are mounted on a first side of a package substrate and the package is mounted to a circuit board with second level interconnect between the circuit board and the package substrate. The term "processor" may refer to any device or portion of a device that processes, for instance, electronic data from registers and/or memory to transform that electronic data into other electronic data that may be stored in registers and/or memory.

The communication chips 406 also may each include an integrated circuit die packaged within the communication chip 406. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein. Further note that processor 404 and communication chip 406 may be arranged and mounted as variously described herein, according to some embodiments and as will be appreciated.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit device, comprising a core having a first planar side and an opposite second planar side; a first dielectric material on the first side of the core, the first dielectric material having a first coefficient of thermal expansion and a first Young's modulus; and a second dielectric material on the second side of the core, the second dielectric material having a second coefficient of thermal expansion greater than the first coefficient of thermal expansion and a second Young's modulus less than the first Young's modulus.

Example 2 includes the subject matter of Example 1, wherein the first coefficient of thermal expansion is less than 15 ppm/° C. and the first Young's modulus is at least 10 GPa.

Example 3 includes the subject matter of Examples 1 or 2, wherein the first coefficient of thermal expansion is less than 10 ppm/° C.

Example 4 includes the subject matter of Example 3, wherein the first coefficient of thermal expansion is no greater than 6 ppm/° C.

Example 5 includes the subject matter of any of Examples 1-4, wherein the second coefficient of thermal expansion is at least 35 ppm/° C.

Example 6 includes the subject matter of Example 5, wherein the second coefficient of thermal expansion is at least 40 ppm/° C.

Example 7 includes the subject matter of any of Examples 1-6, wherein the second Young's modulus is less than 10 GPa.

Example 8 includes the subject matter of Example 7, wherein the second Young's modulus is less than 6 GPa Example 9 includes the subject matter of Example 8, wherein the second Young's modulus is less than 1 GPa.

Example 10 includes the subject matter of any of Examples Example 1-9, wherein the first Young's modulus is at least 12 GPa and the second Young's modulus is less than 6 GPa.

Example 11 includes the subject matter of Example 10, wherein the first Young's modulus is about 15 GPa and the second Young's modulus is about 4 GPa.

Example 12 includes the subject matter of any of Examples 1-11, wherein the first dielectric material has an elongation of less than 2% and the second dielectric material has an elongation greater than 4%.

Example 13 includes the subject matter of any of Examples 1-12, wherein the core has a Young's modulus of at least 40 GPa.

Example 14 includes the subject matter of Example 13, wherein the core comprises a ceramic.

Example 15 includes the subject matter of any of Examples 1-12, wherein the core has a Young's modulus of at least 60 GPa.

Example 16 includes the subject matter of Example 15, wherein the core comprises a glass.

Example 17 includes the subject matter of any of Examples 1-12, wherein the core has a Young's modulus of at least 120 GPa.

Example 18 includes the subject matter of Example 17, wherein the core comprises a glass cloth-reinforced epoxy.

Example 19 includes the subject matter of any of Examples 1-18, and further comprises at least one layer of the first dielectric material on the second side, wherein the second dielectric material is on the at least one layer of the first dielectric material on the second side.

Example 20 includes the subject matter of any of Examples 1-19, and further comprises a semiconductor chip electrically connected to the first side via a first level interconnect; and an integrated circuit package electrically connected to the second side via a second level interconnect.

Example 21 includes the subject matter of Example 20, wherein the integrated circuit device comprises a processor.

Example 22 includes the subject matter of Examples 20 or 21, wherein the semiconductor chip has a substrate comprising silicon.

Example 23 includes the subject matter of any of Examples 20-22, wherein the semiconductor chip comprises a light-emitting device.

Example 24 is a circuit board assembly comprising the integrated circuit device of any of Examples 21-23.

Example 25 includes the subject matter of Example 24 and further comprises a first level interconnect between the semiconductor chip and the package substrate and a second level interconnect between the printed circuit board and the package substrate.

Example 26 is a computing system comprising the integrated circuit device of any of Examples 1-23.

Example 27 includes the subject matter of Example 26, wherein the computing system is configured as a communication device, a networking device, a server computer, or a personal computer.

Example 28 is an integrated circuit comprising a package substrate having a core with a first side and an opposite second side; a first dielectric material on the first side, wherein one or more first conductive interconnect features are at least partially within the first dielectric material; and a second dielectric material on the second side, wherein one or more second conductive interconnect features are at least partially within the second dielectric material; and a third dielectric material on the second dielectric material and compositionally distinct from the second dielectric material, the third dielectric material having an elongation of at least 30% and a Young's modulus of less than 100 MPa.

Example 29 includes the subject matter of Example 28, wherein the third dielectric has an elongation of at least 40%.

Example 30 includes the subject matter of Example 28, wherein the third dielectric has an elongation of at least 50%.

Example 31 includes the subject matter of Example 28, wherein the third dielectric has an elongation of at least 60%.

Example 32 includes the subject matter of any of Examples 28-31, wherein the third dielectric has a coefficient of thermal expansion of at least 40 ppm/° C.

Example 33 includes the subject matter of any of Examples 28-31, wherein the third dielectric has a coefficient of thermal expansion of at least 60 ppm/° C.

Example 34 includes the subject matter of any of Examples 28-31, wherein the third dielectric has a coefficient of thermal expansion of at least 90 ppm/° C.

Example 35 includes the subject matter of any of Examples 28-34, wherein the third dielectric has a modulus no greater than 70 MPa.

Example 36 includes the subject matter of any of Examples 28-34, wherein the third dielectric has a modulus from 30 MPa to 70 MPa.

Example 37 includes the subject matter of any of Examples 28-36, wherein the third dielectric has a modulus no greater than 50 MPa.

Example 38 includes the subject matter of any of Examples 28-37, wherein the first dielectric has a coefficient of thermal expansion of no greater than 10 ppm/° C.

Example 39 includes the subject matter of any of Examples 28-37, wherein the first dielectric has a coefficient of thermal expansion of no greater than 5 ppm/° C.

Example 40 includes the subject matter of any of Examples 28-39, wherein the second dielectric is the same as the first dielectric.

Example 41 includes the subject matter of any of Examples 28-39, wherein the second dielectric is compositionally distinct from the first dielectric.

Example 42 is an integrated circuit package comprising the integrated circuit of any of Examples 28-41 and further comprises a semiconductor chip mounted to the first side and a printed circuit board mounted to the second side.

Example 43 includes the subject matter of Example 42, wherein the integrated circuit package comprises a processor.

Example 44 includes the subject matter of any of Examples 42 or 43, wherein the semiconductor chip comprises silicon.

Example 45 includes the subject matter of any of Examples 42-44, wherein the semiconductor chip includes a light-emitting device.

Example 46 is an integrated circuit device, comprising a core comprising a first dielectric material and having a first planar side and an opposite second planar side; a second dielectric material on the first side of the core, the second dielectric material having a first coefficient of thermal expansion and a first Young's modulus; and a third dielectric material on the second side of the core, the third dielectric material having a second coefficient of thermal expansion greater than the first coefficient of thermal expansion and a second Young's modulus less than the first Young's modulus; wherein the first, second, and third dielectric materials are compositionally distinct from one another.

Example 47 includes the subject matter of Example 46, wherein the first coefficient of thermal expansion is less than 15 ppm/° C. and the first Young's modulus is at least 10 GPa, and the second coefficient of thermal expansion is at least 35 ppm/° C. and the second Young's modulus is less than 6 GPa.

Example 48 includes the subject matter of Example 46 or 47, wherein the first dielectric material has an elongation of less than 2% and the second dielectric material has an elongation greater than 4%.

Example 49 includes the subject matter of any of Examples 46-48, wherein the core has a Young's modulus of at least 40 GPa.

Example 50 includes the subject matter of any of Examples 46-49, wherein the core comprises ceramic, phenolic, glass cloth-reinforced epoxy, borosilicate glass, and/or fused silica.

Example 51 includes the subject matter of any of Examples 46-50 and further comprises a semiconductor chip electrically connected to the first side via a first level interconnect, and an integrated circuit package electrically connected to the second side via a second level interconnect.

Example 52 is a printed circuit board comprising the integrated circuit device of any of Examples 1-51.

Example 53 includes the subject matter of example 52, wherein the printed circuit board is a mother board.

Example 54 is an electronic system comprising the printed circuit board of Example 52 or 53.

Example 55 includes the subject matter of Example 54, wherein the electronic system is one of a computer, a communication device, or a mobile phone.

Example 56 is an integrated circuit comprising a core with a first side and an opposite second side, the core comprising ceramic and/or glass; a first dielectric material on the first side and having one or more first interconnect features therein; a second dielectric material on the second side and having one or more second interconnect features therein; and a third dielectric material on the second dielectric material and having one or more third interconnect features therein, the third dielectric material being compositionally distinct from the second dielectric material and having an elongation of at least 30% and a Young's modulus of less than 100 MPa.

Example 57 includes the subject matter of Example 56, wherein the third dielectric material has an elongation of at least 40%, a coefficient of thermal expansion of at least 40 ppm/° C., and a Young's modulus in the range of 30 MPa to 70 MPa.

Example 58 includes the subject matter of Example 56 or 57, wherein the first dielectric material has a coefficient of thermal expansion of no greater than 10 ppm/° C.

Example 59 includes the subject matter of any of Examples 56-58, wherein the second dielectric material is compositionally distinct from the first dielectric material.

Example 60 includes the subject matter of any of Examples 56-59 and further comprises a semiconductor chip mounted to the first side and a printed circuit board mounted to the second side.

Example 61 is a computing system comprising the subject matter of Example 20, 42, or 60.

Example 62 includes the subject matter of Example 61, wherein the integrated circuit comprises a processor.

Example 63 includes the subject matter of Examples 61 or 62, wherein the semiconductor chip has a substrate comprising silicon.

Example 64 includes the subject matter of any of Examples 61-63, wherein the semiconductor chip comprises a light-emitting device.

Example 65 includes the subject matter of Example 64, wherein the light-emitting device is a laser diode.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit device, comprising:
    a core having a first planar side and an opposite second planar side;
    a first dielectric material on the first side of the core, the first dielectric material having a first coefficient of thermal expansion and a first Young's modulus; and
    a second dielectric material on the second side of the core, the second dielectric material having a second coefficient of thermal expansion greater than the first coefficient of thermal expansion and a second Young's modulus less than the first Young's modulus.

2. The integrated circuit device of claim 1, wherein the first coefficient of thermal expansion is less than 15 ppm/° C. and the first Young's modulus is at least 10 GPa.

3. The integrated circuit device of claim 2, wherein the first coefficient of thermal expansion is less than 10 ppm/° C.

4. The integrated circuit device of claim 2, wherein the second coefficient of thermal expansion is at least 35 ppm/° C.

5. The integrated circuit device of claim 2, wherein the second Young's modulus is less than 6 GPa.

6. The integrated circuit device of claim 2, wherein the second Young's modulus is less than 1 GPa.

7. The integrated circuit device of claim 1, wherein the first dielectric material has an elongation of less than 2% and the second dielectric material has an elongation greater than 4%.

8. The integrated circuit device of claim 1, wherein the core has a Young's modulus of at least 40 GPa.

9. The integrated circuit device of claim 1 further comprising: a semiconductor chip electrically connected to the first side via a first level interconnect; and an integrated circuit package electrically connected to the second side via a second level interconnect.

10. The integrated circuit device of claim 1, wherein the core comprises ceramic, phenolic, glass cloth-reinforced epoxy, borosilicate glass, and/or fused silica.

11. An integrated circuit comprising:
    a package substrate having a core with a first side and an opposite second side;
    a first dielectric material on the first side, wherein one or more first conductive interconnect features are at least partially within the first dielectric material; and
    a second dielectric material on the second side, wherein one or more second conductive interconnect features are at least partially within the second dielectric material; and
    a third dielectric material on the second dielectric material and compositionally distinct from the second dielectric material, the third dielectric material having an elongation of at least 30% and a Young's modulus of less than 100 MPa.

12. The integrated circuit of claim 11, wherein the third dielectric material has an elongation of at least 40%.

13. The integrated circuit of claim 12, wherein the third dielectric material has a coefficient of thermal expansion of at least 40 ppm/° C.

14. The integrated circuit of claim 12, wherein the third dielectric material has a Young's modulus in the range of 30 MPa to 70 MPa.

15. The integrated circuit of claim 14, wherein the first dielectric material has a coefficient of thermal expansion of no greater than 10 ppm/° C.

16. The integrated circuit of claim 14, wherein the first dielectric material has a coefficient of thermal expansion of no greater than 5 ppm/° C.

17. The integrated circuit of claim 11, wherein the second dielectric material is compositionally distinct from the first dielectric material.

18. The integrated circuit of claim 11 further comprising: a semiconductor chip mounted to the first side; and a printed circuit board mounted to the second side.

19. A circuit board assembly comprising the integrated circuit of claim 18.

20. The circuit board assembly of claim 19 further comprising: a first level interconnect between the semiconductor chip and the package substrate; and a second level interconnect between the printed circuit board and the package substrate.

* * * * *